(12) United States Patent
Richter et al.

(10) Patent No.: US 10,163,933 B1
(45) Date of Patent: Dec. 25, 2018

(54) FERRO-FET DEVICE WITH BURIED BUFFER/FERROELECTRIC LAYER STACK

(71) Applicant: GLOBALFOUNDRIES Inc., Grand Cayman (KY)

(72) Inventors: Ralf Richter, Radebeul (DE); Stefan Dünkel, Dresden (DE); Martin Trentzsch, Dresden (DE); Sven Beyer, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/676,529

(22) Filed: Aug. 14, 2017

(51) Int. Cl.
| | |
|---|---|
| *H01L 29/10* | (2006.01) |
| *H01L 29/76* | (2006.01) |
| *H01L 31/036* | (2006.01) |
| *H01L 31/112* | (2006.01) |
| *H01L 27/1159* | (2017.01) |
| *H01L 27/11597* | (2017.01) |
| *H01L 29/16* | (2006.01) |
| *H01L 29/04* | (2006.01) |
| *H01L 29/66* | (2006.01) |
| *H01L 29/49* | (2006.01) |
| *H01L 29/78* | (2006.01) |
| *H01L 21/28* | (2006.01) |
| *H01L 29/51* | (2006.01) |

(52) U.S. Cl.
CPC .... *H01L 27/1159* (2013.01); *H01L 21/28088* (2013.01); *H01L 21/28291* (2013.01); *H01L 27/11597* (2013.01); *H01L 29/04* (2013.01); *H01L 29/16* (2013.01); *H01L 29/4966* (2013.01); *H01L 29/516* (2013.01); *H01L 29/6684* (2013.01); *H01L 29/78391* (2014.09)

(58) Field of Classification Search
USPC ..... 257/49, 66, E27.104, E21.664, E21.009, 257/295, E21.272, E27.081, E27.084, 257/E29.272, E29.164; 365/145
See application file for complete search history.

(56) References Cited

U.S. PATENT DOCUMENTS

| | | | | |
|---|---|---|---|---|
| 6,734,527 | B1 * | 5/2004 | Xiang | H01L 21/823807 257/616 |
| 9,257,191 | B1 * | 2/2016 | Yuan | G11C 11/5635 |
| 9,853,150 | B1 * | 12/2017 | Colinge | H01L 29/78391 |

(Continued)

OTHER PUBLICATIONS

Lomenzo et al., "Ferroelectric Si-Doped HfO₂ Device Properties on Highly Doped Germanium", published at IEEE Electron Device Letters, vol. 36, No. 8, on Aug. 2015, retrieved on Jun. 22, 2017 from "http://www.ieee.org/publications_standards/publications/rights/index.html", pp. 766-768.

(Continued)

*Primary Examiner* — Tram H Nguyen
(74) *Attorney, Agent, or Firm* — Ditthavong & Steiner, P.C.

(57) ABSTRACT

Methods of forming a buffer layer to imprint ferroelectric phase in a ferroelectric layer and the resulting devices are provided. Embodiments include forming a substrate; forming a buffer layer over the substrate; forming a ferroelectric layer over the buffer layer; forming a channel layer over the ferroelectric layer; forming a gate oxide layer over a portion of the channel layer; and forming a gate over the gate oxide layer.

10 Claims, 6 Drawing Sheets

(56) References Cited

U.S. PATENT DOCUMENTS

| | | | | |
|---|---|---|---|---|
| 2008/0251816 A1* | 10/2008 | Tanaka | ............ | H01L 21/28291 |
| | | | | 257/255 |
| 2009/0290404 A1* | 11/2009 | Kaneko | ............ | G11C 11/22 |
| | | | | 365/145 |
| 2011/0299318 A1* | 12/2011 | Kaneko | ............ | G11C 11/22 |
| | | | | 365/145 |
| 2016/0322368 A1* | 11/2016 | Sun | ............ | H01L 29/78391 |

OTHER PUBLICATIONS

Shimizu et al., "The demonstration of significant ferroelectricity in epitaxial Y-doped $HfO_2$ film", published at Sci. Rep. 6, 32931 doi: 10.1038/srep32931 (2016) on Sep. 9, 2016, retrieved on Jun. 22, 2017, from "www.nature.com/scientificreports", 8 pages.

* cited by examiner

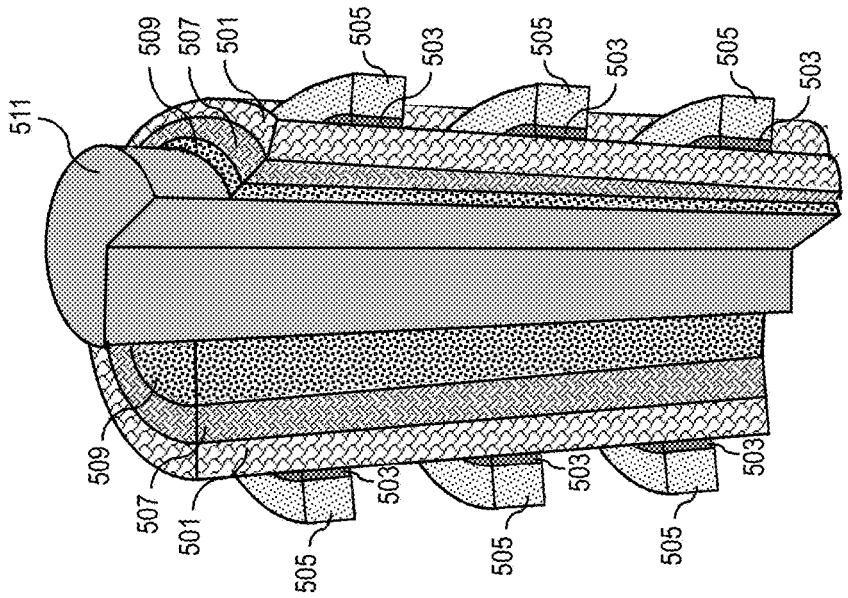
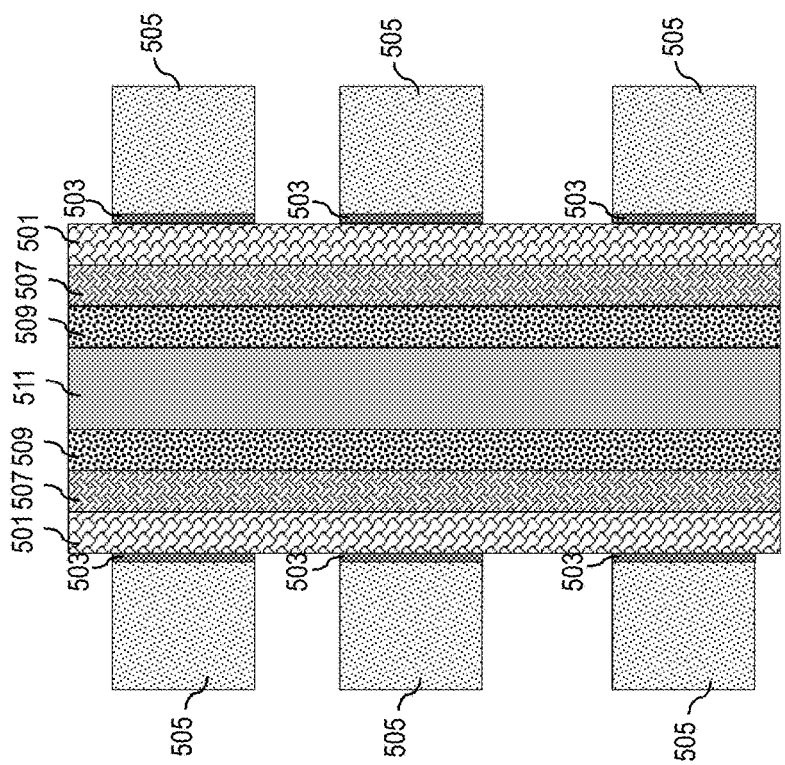
FIG. 5B
FIG. 5A

FERRO-FET DEVICE WITH BURIED BUFFER/FERROELECTRIC LAYER STACK

TECHNICAL FIELD

The present disclosure relates to memory design for semiconductor devices. The present disclosure is particularly applicable to non-volatile memory (NVM) memory cell structure, i.e., a ferroelectric field-effect transistor (FeFET).

BACKGROUND

Demand for FeFET is increasing because of its larger storage capacity (e.g., wider memory window) and faster access speed. In a FeFET, switching of the polarization in different directions is caused by applying an electrical field via a voltage between a transistor gate and a transistor channel. A known FeFET includes a ferroelectric high-k layer of a gate stack formed by atomic layer deposition (ALD) on a silicon (Si)/oxide interface that is polycrystalline (i.e., a mixture of different phases wherein not all of the phases are ferroelectric). However, this design results in suboptimal switching properties of the FeFET (program/erase performance) and the Si/oxide substrate is not optimal for ferroelectric growth. As a consequence, there is no degree of freedom to modify the transistor channel. In addition, application of high voltage, e.g., 4 V to 5 V, to the known FeFET gate stack (with a ferroelectric layer over the gate oxide) to read information generates a charge trapping in the gate oxide, which causes irreversible damage because the ferroelectric layer is not in a state to enable switching of the polarization.

A need therefore exists for methodology enabling formation of a ferroelectric layer below a transistor channel and over a buffer layer.

SUMMARY

An aspect of the present disclosure is a method of forming a buffer layer to imprint ferroelectric phase in a ferroelectric layer.

Another aspect of the present disclosure is a memory device with an imprinted ferroelectric layer over a buffer layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a substrate; forming a buffer layer over the substrate; forming a ferroelectric layer over the buffer layer; forming a channel layer over the ferroelectric layer; forming a gate oxide layer over a portion of the channel layer; and forming a gate over the gate oxide layer.

Aspects of the present disclosure include forming the buffer layer of germanium (Ge). Further aspects include forming the ferroelectric layer of hafnium oxide ($HfO_2$). Another aspect includes forming the channel layer of Si. Additional aspects include forming an imprint layer over the ferroelectric layer prior to forming the channel layer; annealing the imprint, ferroelectric, and buffer layers and the substrate; removing the imprint layer; and forming the channel layer over the ferroelectric layer. Further aspects include forming the imprint layer of titanium nitride (TiN). Additional aspects include forming the imprint layer to a thickness of 10 nm to 20 nm. Further aspects include annealing the imprint, ferroelectric, and buffer layers and the substrate at a temperature of 600° C. and above.

Another aspect of the present disclosure is a device including: a substrate; a buffer layer over the substrate; a ferroelectric layer over the buffer layer; a channel layer over the ferroelectric layer; a gate oxide layer over a portion of the channel layer; and a gate over the gate oxide layer.

Aspects of the device include the buffer layer including Ge. Another aspect includes the ferroelectric layer including $HfO_2$. Other aspects include the ferroelectric layer having a thickness of 5 nanometer (nm) to 15 nm. A further aspect includes the channel layer including Si. Additional aspects include the channel layer having a thickness of 5 nm to 10 nm.

A further aspect of the present disclosure is a method including: forming a plurality of gates over an external surface of a cylindrical poly-Si channel; forming a gate oxide layer between each gate and the external surface of the cylindrical poly-Si channel; forming a buffer layer over the internal surface of the cylindrical poly-Si channel; forming a ferroelectric layer over the buffer layer; and forming a contacting electrode layer over the ferroelectric layer.

Aspects of the present disclosure include forming the contacting electrode layer of TiN. Another aspect includes forming the ferroelectric layer of $HfO_2$.

A further aspect of the present disclosure is a device including: a plurality of gates over an external surface of a cylindrical poly-Si channel; a gate oxide layer between each gate and the external surface of the cylindrical poly-Si channel; a buffer layer over the internal surface of the cylindrical poly-Si channel; a ferroelectric layer over the buffer layer; and a contacting electrode layer over the ferroelectric layer.

Aspects of the present disclosure include the contacting electrode layer including TiN. Another aspect includes the ferroelectric layer including $HfO_2$.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 5A schematically illustrates a cross-sectional view of a layer sequence in a three-dimensional structure with a transistor channel between a gate stack and a ferroelectric layer, in accordance with an exemplary embodiment;

FIG. 5B schematically illustrates a three dimensional (3D) view of FIG. 5A; and

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of polycrystalline ferroelectric layer yielding sub-optimal switching properties for FeFETs attendant upon forming a FeFET with a buffer layer to imprint a ferroelectric phase in a ferroelectric layer. The problem is solved, inter alia, by forming a layer stack with a buffer layer to support epitaxial growth of a pure ferroelectric layer resulting in improved FeFET device characteristics.

Methodology in accordance with embodiments of the present disclosure includes forming a substrate. A buffer layer is formed over the substrate. A ferroelectric layer is formed over the buffer layer. A channel layer is formed over the ferroelectric layer. A gate oxide layer is formed over a portion of the channel layer, and a gate is formed over the gate oxide layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
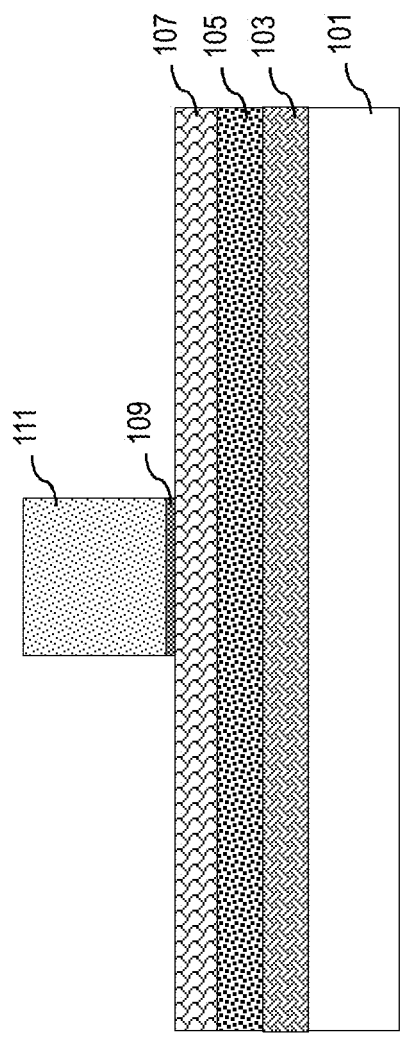
FIG. 1 schematically illustrates a cross-sectional view of a process flow for forming a buffer layer for epitaxial growth of a ferroelectric layer, in accordance with an exemplary embodiment.

FIG. 1 schematically illustrates a cross-sectional view of a process flow for forming a buffer layer for epitaxial growth of a ferroelectric layer, in accordance with an exemplary embodiment. Adverting to FIG. 1, a substrate 101 is formed, e.g., of Si/oxide. Next, a buffer layer 103 is formed, e.g., of Ge or other materials having similar properties, over the substrate 101. A ferroelectric layer 105 is then epitaxially grown, e.g., of $HfO_2$ or other materials having similar properties, over the buffer layer 103. The ferroelectric layer 105 is formed, e.g., to a thickness of 5 nm to 15 nm. Next, a channel layer 107 is formed, e.g., of Si, over the ferroelectric layer 105. The channel layer 107 may be formed, e.g., to a thickness of 5 nm to 10 nm. Then, a gate oxide layer 109 is formed over a portion of the channel layer 107. Subsequently, a gate 111 is formed over the gate oxide layer 109. In this instance, the ferroelectric layer 105 is formed below the channel layer 107, which causes the polarization of the resulting device to occur below the channel layer 107.

Figure 2:
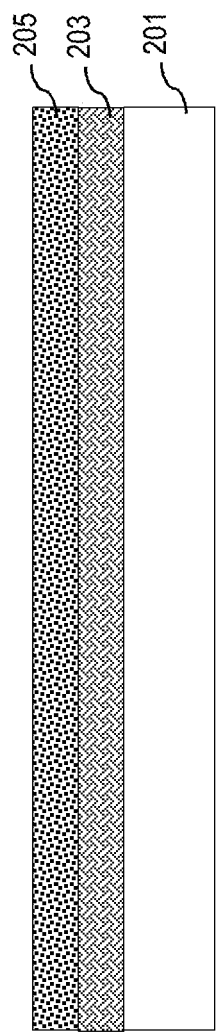
FIGS. 2 through 4 schematically illustrate cross-sectional views of a process flow for integrating an imprint layer with a buffer layer for enhancing ferroelectric behavior, in accordance with an exemplary embodiment.
Figure 3:
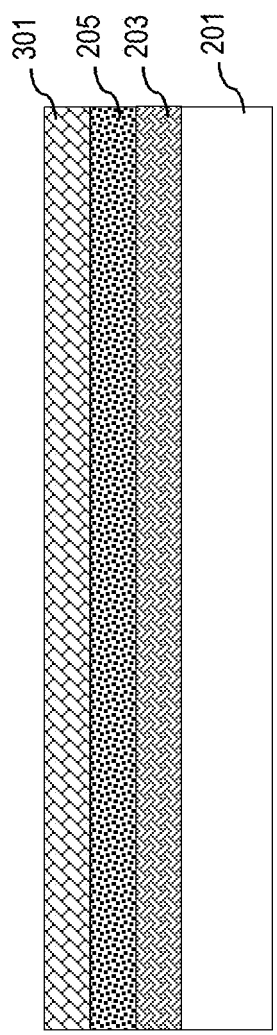
Figure 4:
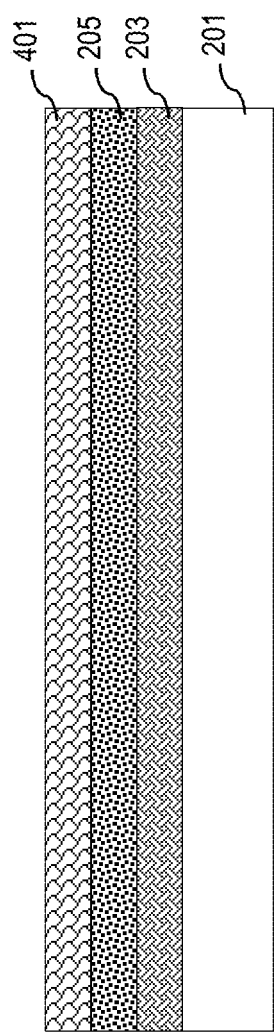

FIGS. 2 through 4 schematically illustrate cross-sectional views of a process flow for integrating an imprint layer with a buffer layer for enhancing ferroelectric behavior, in accordance with an exemplary embodiment. The process steps in FIG. 2 are similar to the process steps of FIG. 1. Adverting to FIG. 2, a substrate 201 is formed, e.g., of Si/oxide. A buffer layer 203 is formed, e.g., of Ge or other materials having similar properties, over the substrate 201. A ferroelectric layer 205 is then formed, e.g., of $HfO_2$ or other materials having similar properties, over the buffer layer 203. The ferroelectric layer 205 is formed by ALD, e.g., to a thickness of 5 nm to 15 nm, and is amorphous.

Next, an imprint layer 301 is formed, e.g., of TiN, over the ferroelectric layer 205, as depicted in FIG. 3. The imprint layer 301 is formed, e.g., to a thickness of 10 nm to 20 nm. The buffer layer 203 imprints orthorhombic/ferroelectric phase to the ferroelectric layer 205 from the bottom, and the imprint layer 301 imprints orthorhombic/ferroelectric phase to the ferroelectric layer 205 from the top. Simultaneously, the imprint layer 301, the ferroelectric layer 205, the buffer layer 203 and the substrate 201 are annealed (not shown for illustrative convenience) at a temperature, e.g., of 600° C. and above for a relatively short period, e.g., few seconds to a minute. In this instance, the annealing temperature and time depends on the materials. The annealing performed in conjunction with the imprints from the top and the bottom results in a purer and an orthorhombic ferroelectric layer 205. Adverting to FIG. 4, once the imprint layer 301 is removed (not shown for illustrative convenience), a channel layer 401 is formed, e.g., of Si, over the ferroelectric layer 205. Thereafter, a gate 111 and gate oxide layer 109 of FIG. 1 are formed over the channel layer 401 as described above.

Figure 5C:
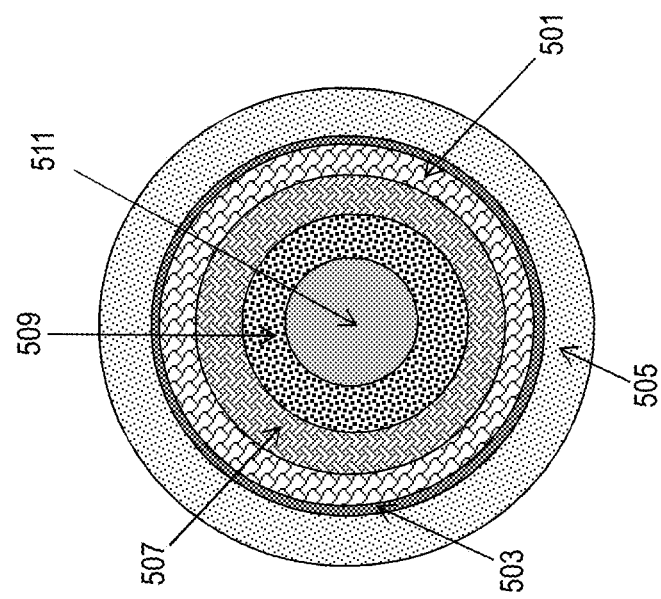
FIG. 5C schematically illustrates a top view of FIG. 5A.

FIG. 5A schematically illustrates a cross-sectional view of a layer sequence in a three-dimensional structure with a transistor channel between a gate stack and a ferroelectric layer, in accordance with an exemplary embodiment, and FIGS. 5B and 5C schematically illustrates a 3D view and a top view of FIG. 5A, respectively. Adverting to FIG. 5A, a cylindrical poly-Si channel 501 is formed, e.g., to a thickness of 5 nm to 10 nm. A gate oxide layer 503 is formed over portions of the external surface of the cylindrical poly-Si channel 501. Next, a plurality of gates 505 are formed over the gate oxide layer 503. A buffer layer 507 is then formed, e.g., of Ge or other materials having similar properties, over the internal surface of the cylindrical poly-Si channel 501. Next, a ferroelectric layer 509 is formed, e.g., of $HfO_2$ or other materials having similar properties, over the buffer layer 507. The ferroelectric layer 509 may be formed, e.g., to a thickness of 5 nm to 15 nm. Subsequently, a contacting electrode layer 511 is formed, e.g., of TiN, over the ferroelectric layer 509. In this instance, the contacting electrode layer 511 imprints orthorhombic/ferroelectric phase to the ferroelectric layer 509 during an annealing process.

The embodiments of the present disclosure can achieve several technical effects including the formation of a purer and orthorhombic ferroelectric layer, which improves FeFET device characteristics without exposing the read transistor/gate oxide of the device to high program/erase voltage drops. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for the 28 nm FeFET integration and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a substrate;
forming a buffer layer over the substrate;
forming a ferroelectric layer over the buffer layer;
forming an imprint layer over the ferroelectric layer;
annealing the imprint, ferroelectric, and buffer layers and the substrate;
removing the imprint layer;
forming a channel layer over the ferroelectric layer;
forming a gate oxide layer over a portion of the channel layer; and
forming a gate over the gate oxide layer.

2. The method according to claim 1, comprising forming the buffer layer of germanium (Ge).

3. The method according to claim 1, comprising forming the ferroelectric layer of hafnium oxide ($HfO_2$).

4. The method according to claim 1, comprising forming the channel layer of silicon (Si).

5. The method according to claim 1, comprising forming the imprint layer of titanium nitride (TiN).

6. The method according to claim 1, comprising forming the imprint layer to a thickness of 10 nm to 20 nm.

7. The method according to claim 1, annealing the imprint, ferroelectric, and buffer layers and the substrate at a temperature of 600° C. and above.

8. A method comprising:
forming a plurality of gates over an external surface of a cylindrical poly-Si channel;
forming a gate oxide layer between each gate and the external surface of the cylindrical poly-Si channel;
forming a buffer layer over the internal surface of the cylindrical poly-Si channel;
forming a ferroelectric layer over the buffer layer;
forming a contacting electrode layer over the ferroelectric layer; and
annealing the contacting electrode layer and ferroelectric layer to imprint an orthorhombic/ferroelectric phase to the ferroelectric layer.

9. The method according to claim 8, comprising forming the contacting electrode layer of titanium nitride (TiN).

10. The method according to claim 8, comprising forming the ferroelectric layer of hafnium oxide ($HfO_2$).

* * * * *